United States Patent
Blanquart

(10) Patent No.: US 9,984,869 B1
(45) Date of Patent: May 29, 2018

(54) METHOD OF PLASMA-ASSISTED CYCLIC DEPOSITION USING RAMP-DOWN FLOW OF REACTANT GAS

(71) Applicant: ASM IP Holding B.V., Almere (NL)

(72) Inventor: Timothee Julien Vincent Blanquart, Tama (JP)

(73) Assignee: ASM IP Holding B.V., Almere (NL)

( * ) Notice: Subject to any disclaimer, the term of this patent is extended or adjusted under 35 U.S.C. 154(b) by 0 days. days.

(21) Appl. No.: 15/489,660

(22) Filed: Apr. 17, 2017

(51) Int. Cl.
*H01L 21/02* (2006.01)
*C23C 16/505* (2006.01)
*C23C 16/455* (2006.01)
*C23C 16/34* (2006.01)
*C23C 16/40* (2006.01)

(52) U.S. Cl.
CPC ........ *H01L 21/0228* (2013.01); *C23C 16/345* (2013.01); *C23C 16/401* (2013.01); *C23C 16/45527* (2013.01); *C23C 16/505* (2013.01); *H01L 21/0217* (2013.01); *H01L 21/0234* (2013.01); *H01L 21/02164* (2013.01); *H01L 21/02274* (2013.01)

(58) Field of Classification Search
CPC ............... H01L 21/0234; H01L 21/02274
See application file for complete search history.

(56) References Cited

U.S. PATENT DOCUMENTS

| | | | | |
|---|---|---|---|---|
| 2005/0048797 A1* | 3/2005 | Fukazawa | ......... | H01L 21/02216 438/778 |
| 2010/0143609 A1* | 6/2010 | Fukazawa | ............. | C23C 16/045 427/585 |
| 2011/0171775 A1* | 7/2011 | Yamamoto | ........ | H01L 21/02126 438/99 |

\* cited by examiner

*Primary Examiner* — Mounir Amer
(74) *Attorney, Agent, or Firm* — Snell & Wilmer L.L.P.

(57) ABSTRACT

A method is for forming a nitride or oxide film by plasma-assisted cyclic deposition, one cycle of which includes: feeding a first reactant, a second reactant, and a precursor to a reaction space where a substrate is placed, wherein the second reactant flows at a first flow ratio wherein a flow ratio is defined as a ratio of a flow rate of the second reactant to a total flow rate of gases flowing in the reaction space; and stopping feeding the precursor while continuously feeding the first and second reactants at a flow ratio which is gradually reduced from the first flow ratio to a second flow ratio while applying RF power to the reaction space to expose the substrate to a plasma. The second reactant is constituted by a hydrogen-containing compound or oxygen-containing compound.

20 Claims, 17 Drawing Sheets (a)         (b)

Fig. 16

| | etch conditions | conformality (side/top) | conformality (bottom/top) | conformality (side/bottom) | WERR relative to Tox | | | | WERR conformality | | | loading |
|---|---|---|---|---|---|---|---|---|---|---|---|---|
| | | | | | field | top | side | bottom | side to top | side to bottom | bottom to top | narrow/spaced |
| Com. Ex. 1 | 5 min. 100:1 dHF | 49% (-2/+2) | 49% (-2/+3) | 99% (-6/+6) | 0.54 ±0.05 | 0.5 ±0.05 | >0.78 | >0.62 | >1.5 | >3.4 | 1.6 (-0.3/+0.3) | 84% ±5 |
| Ex. 1 | 5 min. 100:1 dHF | 74% (-5/+6) | 75% (-5/+6) | 99% (-8/+8) | 0.23 ±0.05 | 0.11 ±0.05 | 0.23 ±0.05 | 0.11 ±0.05 | 2.1 (-0.9/+2.8) | 2.1 (-0.9/+2.8) | 1 (-0.6/+1.7) | 97% ±7 |
| Com. Ex. 2 | 6 min. 100:1 dHF | 69% (-5/+5) | 80% (-5/+5) | 86% (-6/+7) | 0.05 ±0.01 | 0.11 ±0.02 | >0.17 | 0.05 ±0.01 | >1.3 | >3.4 | 0.5 (-0.2/+0.2) | 86% ±6 |
| Ex. 2 | 6 min. 100:1 dHF | 78% (-4/+5) | 81% (-5/+5) | 97% (-6/+6) | 0.08 ±0.02 | 0.09 ±0.02 | 0.09 ±0.02 | 0.05 ±0.01 | 1 (-0.2/+0.5) | 1.8 (-0.7/+0.8) | 0.6 (-0.2/+0.4) | 92% ±5 |

US 9,984,869 B1

METHOD OF PLASMA-ASSISTED CYCLIC DEPOSITION USING RAMP-DOWN FLOW OF REACTANT GAS

BACKGROUND OF THE INVENTION

Field of the Invention

The present invention generally relates to a method for forming a nitride or oxide film by plasma-assisted cyclic deposition such as plasma-enhanced atomic layer deposition (PEALD), particularly a method of plasma-assisted cyclic deposition using ramp-down flow of reactant gas.

Description of the Related Art

As methods of depositing conformal dielectric films on substrates, typically cyclic deposition such as atomic layer deposition (ALD) is known. A skilled artisan often uses plasma-enhanced ALD (PEALD) to form conformal dielectric films. PEALD is a deposition technology of dielectric films using chemisorption of precursors and can improve a step coverage of films depositing on recess patterns of substrates, as compared with plasma-enhanced chemical vapor deposition (PECVD). Further, as another plasma-assisted cyclic deposition, cyclic PECVD is also used for depositing conformal dielectric films. However, when depositing a dielectric film such as silicon/metal nitride or oxide films by cyclic plasma-assisted deposition, where nitration or oxidation reaction is conducted in an atmosphere with plasma using a reactant such as $H_2$ or $O_2$, the quality of film in terms of, for example, chemical resistance is sometimes unsatisfactory. For example, films deposited by PEALD using $H_2$ as a reactant may have a high wet etch rate if high amount of hydrogen is incorporated. The present inventor considered that when the hydrogen content is the film is high, lattice removal occurs rapidly in the matrix of the film, indicating that the matrix of the film has an incomplete structure or undensified structure, i.e., more bond breakage and faster HF diffusion. That is, the present inventor believes that the hydrogen content in the film is a critical factor in achieving high chemical resistance, e.g., low wet etch rate, and after extensive experimentation and assiduous study, the present inventor has resolved the above problem.

Any discussion of problems and solutions in relation to the related art has been included in this disclosure solely for the purposes of providing a context for the present invention, and should not be taken as an admission that any or all of the discussion was known at the time the invention was made.

SUMMARY OF THE INVENTION

In an aspect, when a dielectric film such as a SiN film is deposited by PEALD using a hydrogen gas as a reactant, at the beginning of a plasma pulse, hydrogen gas is fed to a reaction space at a flow rate sufficient to generate a hydrogen-rich plasma for good reactivity, whereas at the end of the plasma pulse, no hydrogen gas or a relatively low quantity of hydrogen gas is fed to the reaction space so as to cause efficient cleansing of hydrogen present on a surface of the dielectric film, thereby reducing the hydrogen content in the dielectric film (so as to improve chemical resistance such as wet etch rate) while maintaining good efficiency of plasma reaction. The above approach can be applied to deposition of films constituted by other silicon nitride or metal nitride, or silicon/metal oxide, and to deposition using a reactant other than hydrogen, e.g., hydrogen-containing gas such as ammonia, or oxygen or oxygen-containing gas, or other gas which creates reactive species in a plasma for nitration or oxidation of a precursor. The above approach can also be applied to deposition by cyclic PECVD wherein a precursor is fed in pulses and when no precursor is fed, a relative flow rate of a hydrogen-containing reactant is ramped down or reduced. In this disclosure, the term "ramping down" refers to decreasing in volume, amount, rate, or ratio relative to a reference gas, at a constant rate or a changing rate, in a stepwise manner, or in any other suitable manner, depending on the specific embodiment.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 16 is a table showing wet etching results of films deposited by PEALD according to Comparative Example 1, Example 1, Comparative Example 2, and Example 2.

DETAILED DESCRIPTION OF EMBODIMENTS

Figure 1A:
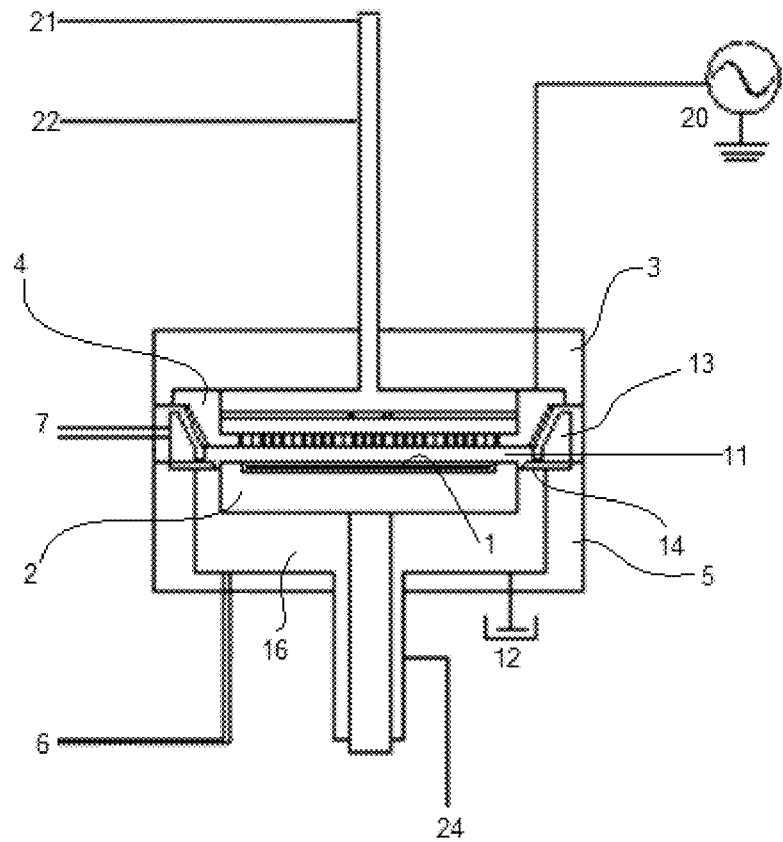
FIG. 1A is a schematic representation of a PEALD (plasma-enhanced atomic layer deposition) apparatus for depositing a dielectric film usable in an embodiment of the present invention.

In this disclosure, "gas" may include vaporized solid and/or liquid and may be constituted by a single gas or a mixture of gases, depending on the context. Likewise, an article "a" or "an" refers to a species or a genus including multiple species, depending on the context. In this disclosure, a process gas introduced to a reaction chamber through a showerhead may be comprised of, consist essentially of, or consist of a silicon- or metal-containing precursor and an additive gas. The additive gas may include a reactant gas for nitriding and/or oxidizing the precursor, and an inert gas (e.g., noble gas) for exciting the precursor, when RF power is applied to the additive gas. The inert gas may be fed to a reaction chamber as a carrier gas and/or a dilution gas. In this disclosure, any additive gas can be used as a purge gas when flowing continuously through the reaction chamber. The precursor and the additive gas can be introduced as a mixed gas or separately to a reaction space. The precursor can be introduced with a carrier gas such as a noble gas. A gas other than the process gas, i.e., a gas introduced without passing through the showerhead, may be used for, e.g., sealing the reaction space, which includes a seal gas such as a noble gas. In some embodiments, the term "precursor" refers generally to a compound that participates in the chemical reaction that produces another compound constituting a film or layer, and particularly to a compound that adsorbs onto a substrate surface and constitutes a film matrix or a main skeleton of a film through a surface reaction by ALD or a compound that constitutes a film matrix or a main skeleton of a film through a gas phase reaction (and partially a surface reaction) by CVD, whereas the term "reactant" refers to a compound, other than precursors, that activates a precursor, modifies a precursor, or catalyzes a reaction of a precursor, wherein the reactant may or may not provide an element (such as N, O, H, C) to be incorporated into a film matrix and become a part of the film matrix, when RF power is applied. The term "inert gas" refers to a gas that excites a precursor when RF power is applied, but it does not necessarily become a part of a film matrix. In some embodiments, an inert gas is a reactant. In other embodiments, an inert gas is not a reactant.

In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

The embodiments will be explained with respect to preferred embodiments. However, the present invention is not limited to the preferred embodiments.

In some embodiments, a method for forming a nitride or oxide film by plasma-assisted cyclic deposition, comprises: (i) feeding a first reactant, a second reactant, and a precursor to a reaction space where a substrate is placed, said second reactant being constituted by a hydrogen-containing compound or oxygen-containing compound, wherein the second reactant flows at a first flow ratio wherein a flow ratio is defined as a ratio of a flow rate of the second reactant to a total flow rate of gases flowing in the reaction space; (ii) stopping feeding the precursor while continuously feeding the first and second reactants at a flow ratio which is gradually reduced from the first flow ratio to a second flow ratio while applying RF power to the reaction space to expose the substrate to a plasma; and (iii) repeating steps (i) and (ii) until a desired thickness of the nitride or oxide film is obtained.

In this disclosure, the term "gradually reduced" (which may be referred to also as "ramped down") refers to reduction at a certain rate (either constant rate (linear change) or changing rate (non-linear change)), or in a stepwise manner, or in a pulsing manner (amplitude of pulses is getting shorter), including or excluding a plateau part(s), over a period of time, or in other suitable manners including those disclosed herein. The flow ratio can be reduced by reducing a flow rate of the second reactant with reference to a flow rate of the first reactant, increasing a flow rate of the first reactant with reference to a flow rate of the second reactant, provided that a flow rate of other gases is substantially unchanged during the plasma pulse (or during application of RF power including not only PEALD but also PERCVD). In some embodiments, the flow ratio can be reduced by increasing a flow rate of carrier gas or dilution gas. As such, the flow ratio can be changed by relatively changing the flow rate of the second reactant with reference to the flow rate of other gases including the first reactant. By relatively reducing the flow rate of the second reactant with reference to the flow rate of the first reactant during the plasma pulse, the film is exposed to a first reactant-rich plasma, thereby promoting densification of the film. By step (ii), the quantity of hydrogen incorporated in the film can be minimized, without engendering low growth rate of a film, and as a result, the wet etch rate of the film can be lowered. In addition, step (ii) also can improve conformality of a film when deposited in a trench.

A plasma is composed of many different species which can be classified in three categories: 1) reactive species, 2) non-reactive ions with high energy responsible for ion bombardment/densification, and 3) species other than 1) and 2). In a plasma, the second reactant is converted to species responsible mainly for reactivity, whereas the first reactant is converted to species responsible mainly for ion bombardment. Thus, a reactant which is responsible for reactivity is subjected to ramping down operation which includes operation where a reactant which is responsible for ion bombardment is subjected to ramping up operation.

In some embodiments, the nitride or oxide film formed by plasma-assisted cyclic deposition is constituted by silicon nitride, metal nitride (such as Ti, Ta, Zr, Al, Ga, W, V, and/or Nb as a metal), silicon oxide, or metal oxide (such as Ti, Zr, Al, Sb, and/or Hf as a metal). In some embodiments, the hydrogen-containing compound or oxygen-containing compound constituting the second reactant is hydrogen, ammonia, and/or $N_2H_4$ for depositing a nitride film, or oxygen, carbon dioxide, nitrogen oxide, ozone, and/or hydrogen peroxide for depositing an oxide film. In some embodiments, the first reactant is nitrogen, Ar, and/or He for depositing a nitride film, or inert gas such as Ar and/or He for depositing an oxide film. The first reactant may be a gas responsible primarily for ion bombardment and generally defined as "ion bombardment species", whereas the second reactant is a gas responsible primarily for reactivity and generally defined as "reactive species". In some embodiments, a ratio of second reactant flow to first reactant flow is 1/1 to 1/100, preferably 1/5 to 1/50, depending on the conditions of RF power application, the type of precursor, etc. In some embodiments, more than one second reactant and/or more than one first reactant are/is used in any suitable combinations. In some embodiments, the precursor is one or more compounds described below: A number of suitable silicon halide precursors can be used in the presently disclosed PEALD processes. At least some of the suitable precursors may have the following general formula:

$$H_{2n+2-y-z}Si_nX_yA_z \quad (1)$$

wherein n=1-10, y=1 or more (and up to 2n+2−z), z=0 or more (and up to 2n+2−y), X is I or Br, and A is a halogen other than X, preferably n=1-5 and more preferably n=1-3 and most preferably 1-2.

According to some embodiments, silicon halide precursors may comprise one or more cyclic compounds. Such precursors may have the following general formula:

$$H_{2n+2-y-z}Si_nX_yA_z \quad (2)$$

wherein the formula (2) compound is cyclic compound, n=3-10, y=1 or more (and up to 2n−z), z=0 or more (and up to 2n−y), X is I or Br, and A is a halogen other than X, preferably n=3-6.

According to some embodiments, silicon halide precursors may comprise one or more iodosilanes. Such precursors may have the following general formula:

$$H_{2n+2-y-z}Si_nI_yA_z \quad (3)$$

wherein n=1-10, y=1 or more (and up to 2n+2−z), z=0 or more (and up to 2n+2−y), and A is a halogen other than I, preferably n=1-5 and more preferably n=1-3 and most preferably 1-2.

According to some embodiments, some silicon halide precursors may comprise one or more cyclic iodosilanes. Such precursors may have the following general formula:

$$H_{2n+2-y-z}Si_nI_yA_z \quad (4)$$

wherein the formula (4) compound is a cyclic compound, n=3-10, y=1 or more (and up to 2n−z), z=0 or more (and up to 2n−y), and A is a halogen other than I, preferably n=3-6.

According to some embodiments, some silicon halide precursors may comprise one or more bromosilanes. Such precursors may have the following general formula:

$$H_{2n+2-y-z}Si_nBr_yA_z \quad (5)$$

wherein n=1-10, y=1 or more (and up to 2n+2−z), z=0 or more (and up to 2n+2−y), and A is a halogen other than Br, preferably n=1-5 and more preferably n=1-3 and most preferably 1-2.

According to some embodiments, some silicon halide precursors may comprise one or more cyclic bromosilanes. Such precursors may have the following general formula:

$$H_{2n+2-y-z}Si_nBr_yA_z \quad (6)$$

wherein the formula (6) compound is a cyclic compound, n=3-10, y=1 or more (and up to 2n−z), z=0 or more (and up to 2n−y), and A is a halogen other than Br, preferably n=3-6.

According to some embodiments, preferred silicon halide precursors comprise one or more iodosilanes. Such precursors may have the following general formula:

$$H_{2n+2-y-z}Si_nI_y \quad (7)$$

wherein n=1-5, y=1 or more (up to 2n+2), preferably n=1-3 and more preferably n=1-2.

According to some embodiments, preferred silicon halide precursors comprise one or more bromosilanes. Such precursors may have the following general formula:

$$H_{2n+2-y-z}Si_nI_y \quad (8)$$

wherein n=1-5, y=1 or more (up to 2n+2), preferably n=1-3 and more preferably n=1-2.

According to some embodiments of the PEALD process, suitable silicon halide precursors can include at least compounds having any one of the general formulas (1) through (8). In general formulas (1) through (8), halides/halogens can include F, Cl, Br, and I. In some embodiments, a silicon halide precursor comprises $SiI_4$, $HSiI_3$, $H_2SiI_2$, $H_3SiI$, $Si_2I_6$, $HSi_2I_5$, $H_2Si_2I_4$, $H_3Si_2I_3$, $H_4Si_2I_2$, $H_5Si_2I$, and/or Si*. In some embodiments, a silicon precursor comprises one of $HSiI_3$, $H_2SiI_2$, $H_3SiI$, $H_2Si_2I_4$, $H_4Si_2I_2$, and/or $H_5Si_2I$. In some embodiments the silicon halide precursor comprises two, three, four, five or six of $HSiI_3$, $H_2SiI_2$, $H_3SiI$, $H_2Si_2I_4$, $H_4Si_2I_2$, and/or $H_5Si_2I$, including any combinations thereof.

In certain embodiments, the Si halide precursor is $H_2SiI_2$. In some embodiments, Si halide precursors of the following formulas below can be used in the PEALD processes: $SiH(N(CH_3)_2)_3$, $SiH(N(CH_3)_2)_3$, $SiH_2(NHtBu)_2$, $C_9H_{29}N_3Si_3$, $C_6H_{17}NSi$, $C_9H_{25}N_3Si$, $C_9H_{25}N_3Si$, $C_8H_{22}N_2Si$, $SiH_4N_2$, $SiH_4$, $(SiH_3)_3N$, $(SiH_3)_2NH$, $(SiH_3)NH_2$, and/or $(SiH_3)_4Si$ for depositing a nitride film.

In some embodiments, the alkylaminosilane is selected from the group consisting of bisdiethylaminosilane (BDEAS), bisizimethylaminosilane (BDMAS), hexylethylaminosilane (HEAD), tetraethylaminosilane (TEAS), tert-butylaminosilane (TBAS), bistert-butylaminosilena (BT-BAS), bisdimethylaminodimethylaminosilane (BDMADMS), heptametyhlsilazane (HIVIDS), trimethysylyldiethlamine (TMSDEA), trimethylsyledimethlamine (TMSDMA), trimethyltoribinylcycletrisilazane (TMT-VCTS), tri strimetylhydroxyamine (TTMSHA), bisdimethylsaminomethylsilane (BDMAMS), and dimetyhlsilyldimethlamine (DMSDMA) for depositing an oxide film.

Preferably, the precursor contains a halogen. In some embodiments, any one or more of the above-listed gases or compounds can be exclusively selected or can expressly be excluded, depending on the target dielectric film to be deposited, the target properties of the film, etc., and/or for practical reasons, operational reasons, etc.

In some embodiments, the plasma-assisted cyclic deposition is cyclic plasma-enhanced chemical vapor deposition (cyclic PECVD), wherein RF power is continuously supplied throughout steps (i) and (ii). In some embodiments, the plasma-assisted cyclic deposition is plasma-enhanced atomic layer deposition (PEALD), wherein RF power is not supplied during step (i). Any other suitable cyclic plasma-assisted deposition can be employed, as long as at least one precursor is fed in pulses to a reaction space, RF power is applied to the reaction space (either continuously or in pulses), and a second reactant is fed to the reaction space (either continuously or in pulses). In some embodiments, RF power is applied to capacitively-coupled parallel electrodes.

In some embodiments, in PEALD, a repeating cycle of PEALD further comprises: (ia) purging the reaction space while continuously supplying the first and second reactants without supplying the precursor and without applying RF power after step (i); and (iia) purging the reaction space while continuously supplying the first reactant or the first and second reactants after step (ii). In some embodiments, in step (ii), the flow of the second reactant is ramped down. In some embodiments, in step (iia), the flow of the second reactant remains at the second flow ratio. In some embodiments, in step (i), the flow of the second reactant starts at the second flow ratio at the beginning of step (i) and is ramped up from the second flow ratio to the first flow ratio. In some embodiments, in step (ii), the flow of the second reactant is ramped down at a constant rate. In some embodiments, in step (ii), the flow of the second reactant is ramped down stepwise. In some embodiments, in step (ii), RF power is ramped up while the flow of the second reactant is ramped down. In some embodiments, in step (ii), the flow of the second reactant is ramped down to the second flow ratio before an end of step (ii) and remains at the second flow ratio until the end of step (ii). In some embodiments, in step (ii), RF power is higher while the flow of the second reactant remains at the second flow ratio, than while the flow of the second reactant is ramped down. In some embodiments, in steps (i) through step (iia), the flow of the first reactant is changed in a manner compensating for the change of the flow of the second reactant so that a sum of the flow of the first reactant and the flow of the second reactant remain constant. In some embodiments, in step (ii), the second flow ratio is zero. In some embodiments, the repeating cycle of PEALD further comprises supplying a purge gas other than the first and second reactants. The above-described ramping down patterns of the second reactant can be applied to other plasma-assisted cyclic deposition such as cyclic PECVD.

In some embodiments, the method further comprises, as a post-deposition treatment, exposing the substrate to a plasma of Ar, He, $N_2$, $H_2$, or a mixture of the foregoing at a given ratio. For example, the post-deposition treatment using Ar or a combination of Ar and He at about 150° C. or higher shows the effect of high film densification, and also, the post-deposition treatment conducted for about 8 minutes or longer shows the effect of high film densification. Thus, by combining the deposition of nitride or oxide film by plasma-assisted cyclic deposition using a ramp-down flow of the second reactant, and the post-deposition treatment, a high-quality dielectric film can be obtained more efficiently. For example, instead of applying lengthy Ar plasma post-deposition treatment, the ramp-down operation can shorten the duration of the post-deposition treatment and/or lower the temperature of the post-deposition treatment, and thus can provide high-quality dielectric films with good productivity.

The ramp-down operation also can eliminate complicated and lengthy super cycles of deposition for high-quality dielectric film. "Super cycle" refers to a nanolaminate-type recipe (e.g., repeating a deposition cycle for nanolayer a and a deposition cycle for nanolayer b) or cyclic deposition treatment (e.g., repeating a deposition cycle for nanolayer a and a treatment cycle without deposition).

The embodiments will be explained with respect to the drawings. However, the present invention is not limited to the drawings.

Figure 2:
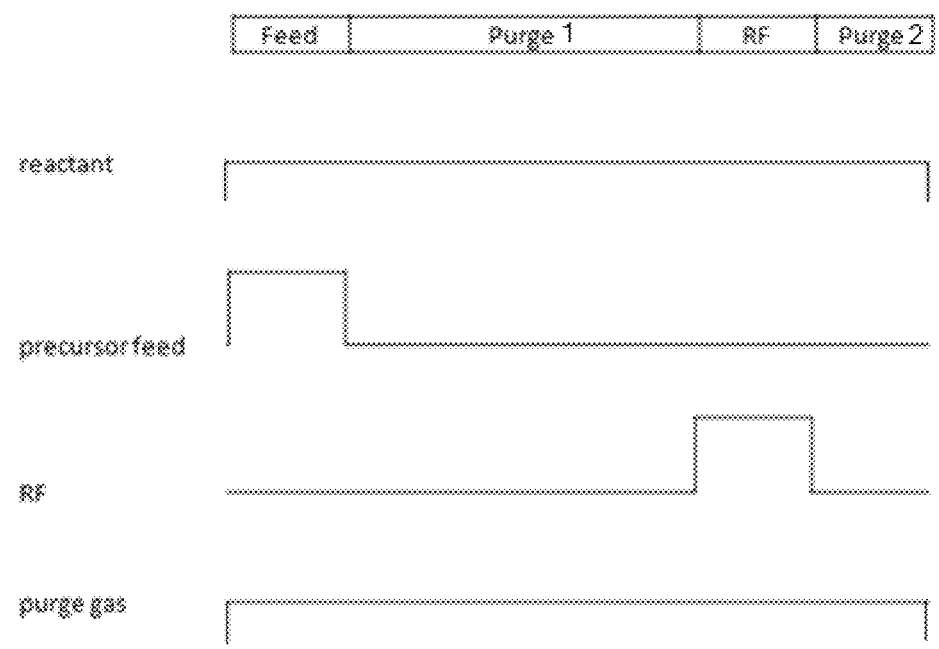
FIG. 2 illustrates one cycle of a conventional PEALD process, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 2 illustrates one cycle of a conventional PEALD process, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state. In the sequence illustrated in FIG. 2, a precursor is supplied to a reaction space in a pulse ("Feed"), and a reactant is continuously supplied, without applying RF power. Also, a purge gas is continuously supplied to the reaction space. After "Feed", the reaction space is purged ("Purge 1") where no precursor is fed to the reaction space, while the reactant and the purge gas are continuously fed to the reaction space, without applying RF power, thereby removing non-chemisorbed precursor and excess gas from the surface of the substrate. Thereafter, a plasma for deposition is generated by applying RF power ("RF") in a pulse ("RF") in situ in the reactant and the purge gas that flow continuously throughout the deposition cycle, without feeding the precursor, thereby exposing the precursor chemisorbed on the surface of the substrate to the plasma and forming a monolayer. After "RF", the reaction space is purged ("Purge 2") where the reactant and the purge gas are continuously fed to the reaction space, without feeding the precursor and without applying RF power to the reaction space, thereby removing by-products and excess gas from the surface of the substrate. Due to the continuous flow of the reactant entering into the reaction space as a constant stream, the precursor chemisorbed on the substrate surface is constantly and continuously exposed to reactive species such as hydrogen radicals generated from the reactant in the plasma, forming a monolayer while the reactive species such as hydrogen radicals are incorporated into the monolayer. However, since hydrogen is incorporated into the film as impurities, the resultant film will have low chemical resistance, e.g., high wet etch rate.

Figure 3:
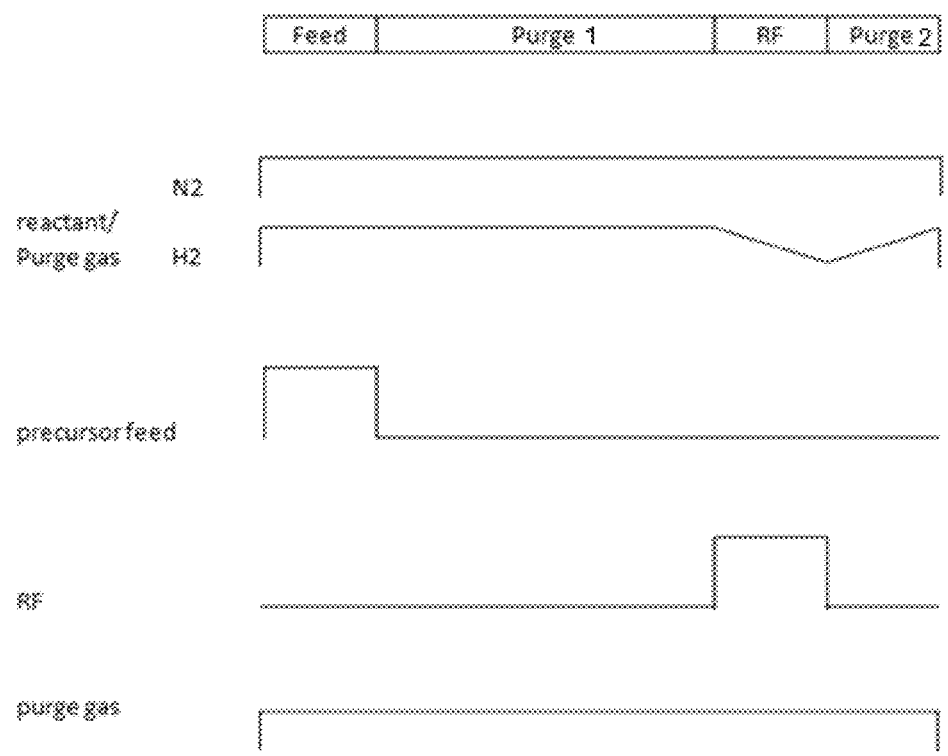
FIG. 3 illustrates one cycle of a PEALD process according to an embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 3 illustrates one cycle of a PEALD process according to an embodiment of the present invention. In the sequence illustrated in FIG. 3, the reactant is comprised of two types: the first one (e.g., $N_2$ in FIG. 3) is responsible primarily for ion bombardment whereas the second one (e.g., $H_2$ in FIG. 3) is responsible primarily for reactivity. In this embodiment, the first reactant flows continuously throughout the cycle, whereas the second reactant flows continuously through "Feed" and "Purge 1" and flows in a manner ramping down in "RF" and ramping up in "Purge 2". The sequence other than the above operation is the same as that in FIG. 2. In some embodiments, a flow of the second reactant is ramped down at a constant rate during "RF" and at the end of "RF", the flow of the second reactant becomes zero. When a flow ratio is defined as a ratio of a flow rate of the second reactant to a total flow rate of gases flowing in the reaction space, the flow ratio is constant through "Feed" and "Purge 1", which is a first flow ratio. The flow ratio is gradually reduced in "RF" from the first flow ratio at the beginning of "RF" to a second flow ratio at the end of "RF", which may be zero. In "Purge 2", the flow ratio is gradually increased from the second flow ratio at the beginning of "Purge 2" to the first flow ratio at the end of "Purge 2". In other words, in "Purge 2", the flow of the second reactant is ramped up to resume the flow rate prior to "RF". The reason for ramping up in "Purge 2" is suppressing generation of particles and degradation of uniformity caused by sudden increase of flow. By ramping down during "RF", the incorporation of the element (e.g., hydrogen) constituting the second reactant into the film can be reduced, lowering the content of the element in the film and thus improving chemical resistance of the film. In the sequence, the first and second reactants flow substantially continuously throughout the cycle (except that the flow of the second reactant may be zero at the end of "RF"), the first and second reactants can also function as a purge gas, and thus, in some embodiments, no other purge gas may be required.

When the flow of the second reactant is ramped down at a constant rate with time over the entire period of "RF", the flow ratio (a ratio of a flow rate of the second reactant to a total flow rate of gases flowing in the reaction space) is not reduced at a constant rate with time since the denominator (the total flow rate) is also changing while the numerator (the flow rate of the second reactant) is changing. Thus, when the flow ratio is set to be reduced at a constant rate, the flow rate of the second reactant needs to be reduced in a non-linear manner.

Figure 4:
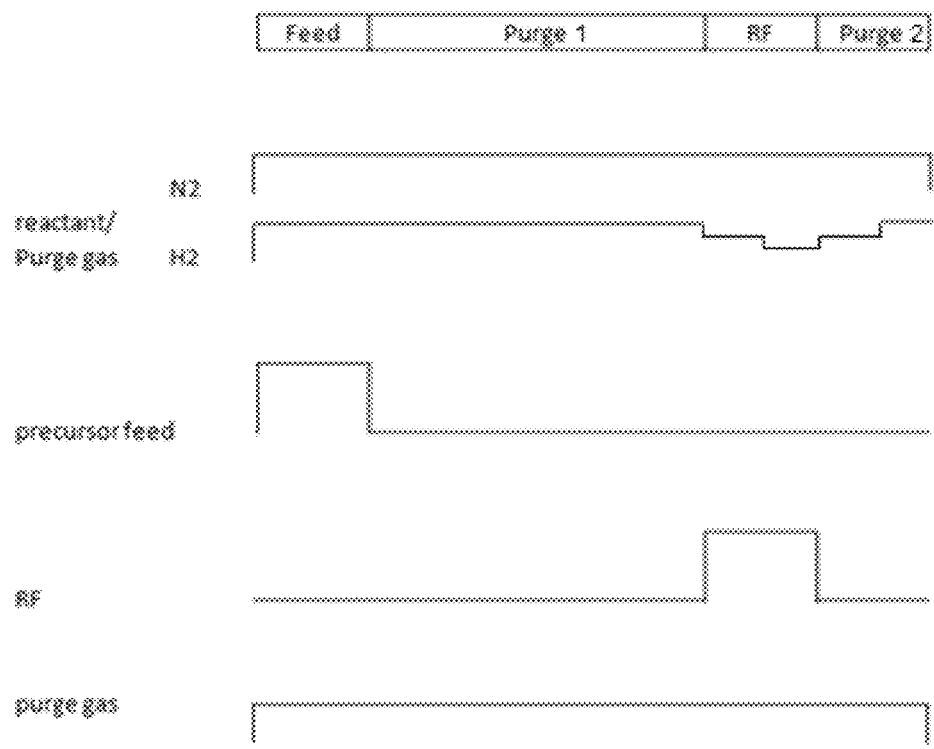
FIG. 4 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 4 illustrates one cycle of a PEALD process according to another embodiment of the present invention. In the sequence illustrated in FIG. 4, the ramping down of the second reactant flow is conducted in a stepwise manner, instead of a linear manner as illustrated in FIG. 3.

Figure 5:
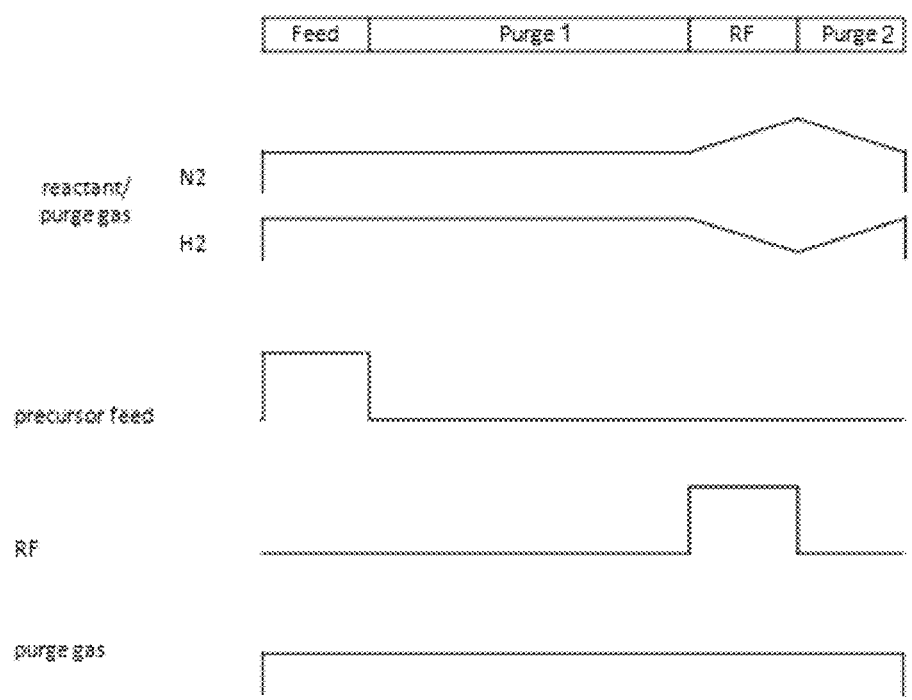
FIG. 5 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 5 illustrates one cycle of a PEALD process according to another embodiment of the present invention. In the sequence illustrated in FIG. 5, the ramping down of the second reactant flow is conducted in the same manner as in the sequence illustrated in FIG. 3, and in addition, a flow of the first reactant is ramped up in "RF" and ramped down in "Purge 2". Since the flow ratio is defined as a ratio of a flow rate of the second reactant to a total flow rate of gases flowing in the reaction space, although the first flow ratio is the same as that in the sequence of FIG. 3 throughout "Feed" and "Purge 1" and constant, the second flow ratio is different in the sequence of FIG. 5 from that in the sequence of FIG. 3 because the total flow rate is higher in the sequence of FIG. 5 than that in the sequence of FIG. 3 due to the ramp-up flow of the first reactant. When the ramp-up flow of the first reactant cancels out the ramp-down flow of the second reactant in terms of the flow rate, the total flow rate is constant throughout the cycle, and the flow ratio can be changed linearly with time over the period of "RF" and "Purge 2". In the sequence of FIG. 5, the second reactant can be diluted more quickly than in the sequence of FIG. 3.

Figure 6:
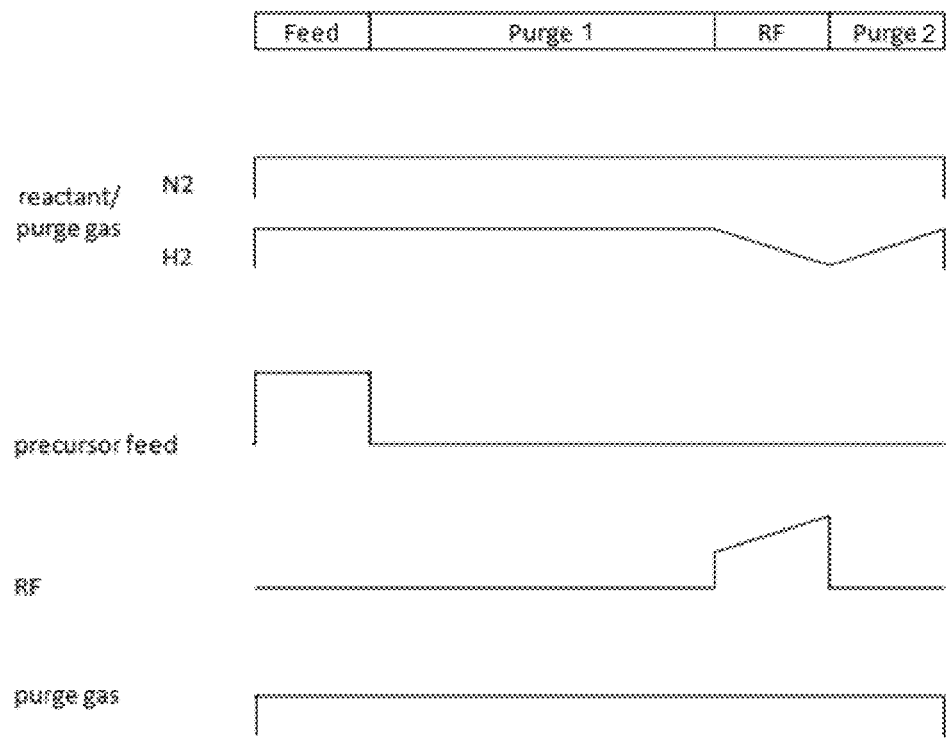
FIG. 6 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 6 illustrates one cycle of a PEALD process according to another embodiment of the present invention. In the sequence illustrated in FIG. 6, the ramping down of the second reactant flow is conducted in the same manner as in the sequence illustrated in FIG. 3, and in addition, RF power is ramped up in "RF" so that although the reactivity of plasma deposition may be lowered due to the ramping down of the second reactant, the ramping up of RF power can compensate for the lowered reactivity without increasing the incorporation of the element of the second reactant into the dielectric film. The ramping up of RF power can also promote the densification process because of higher ion energy of the bombardment species.

Figure 7:
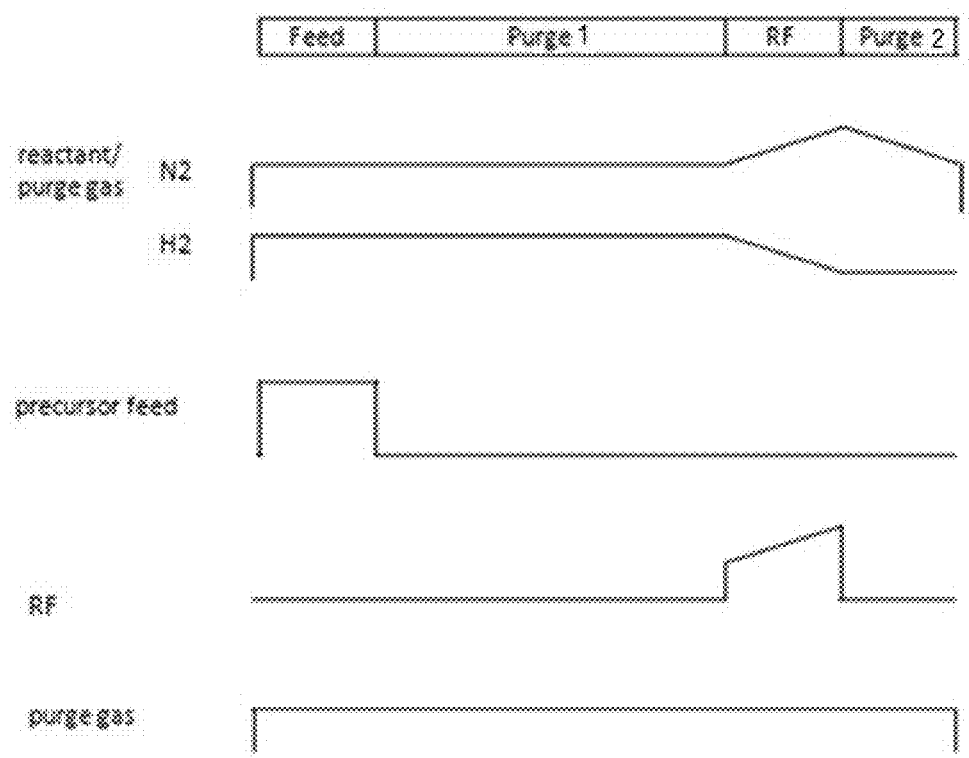
FIG. 7 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 7 illustrates one cycle of a PEALD process according to another embodiment of the present invention. In the sequence illustrated in FIG. 7, the ramping down of the second reactant flow and the ramping up of RF power are conducted in the same manner as in the sequence illustrated in FIG. 6, but the ramping up of the second reactant in "Purge 2" is not conducted. That is, the second reactant maintains flowing at the second flow ratio throughout "Purge 2" (if the second flow ratio is zero, there is no flowing of the second reactant), and resumes flowing at the first flow ratio at the beginning of "Feed". When the first reactant and the purge gas can sufficiently purge the reaction space, the second reactant need not continuously flow in "Purge 2".

Figure 8:
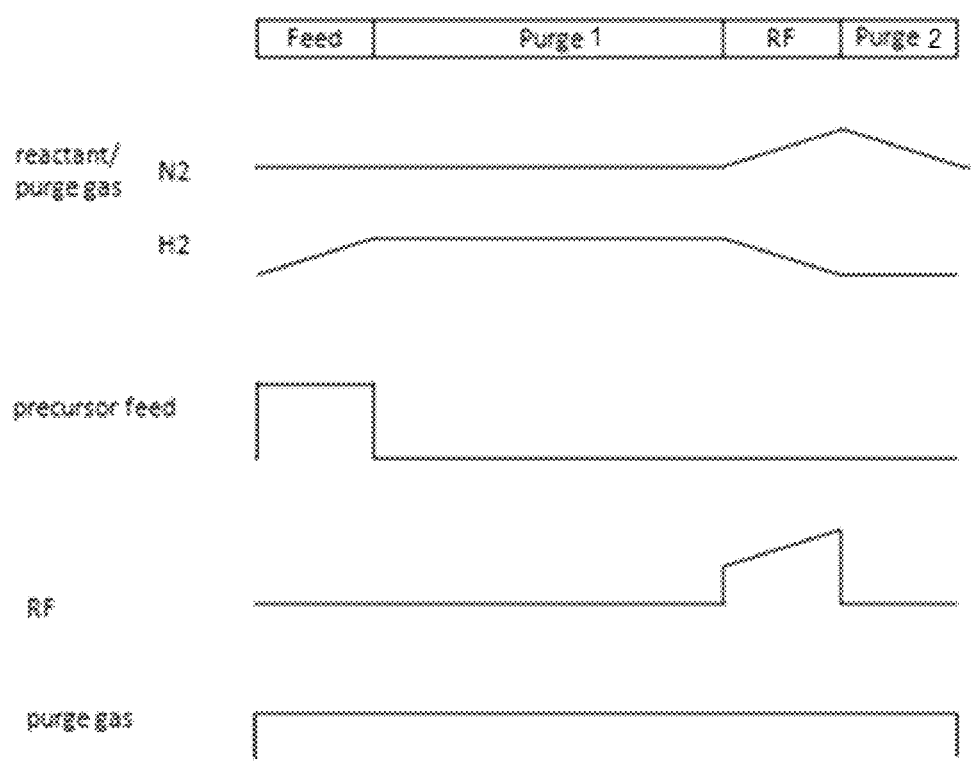
FIG. 8 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 8 illustrates one cycle of a PEALD process according to another embodiment of the present invention. The sequence illustrated in FIG. 8 is the same as that of FIG. 7 except that the second reactant resumes flowing at the first flow ratio by ramping up the second reactant flow from the second flow ratio to the first flow ratio in "Feed".

Figure 9:
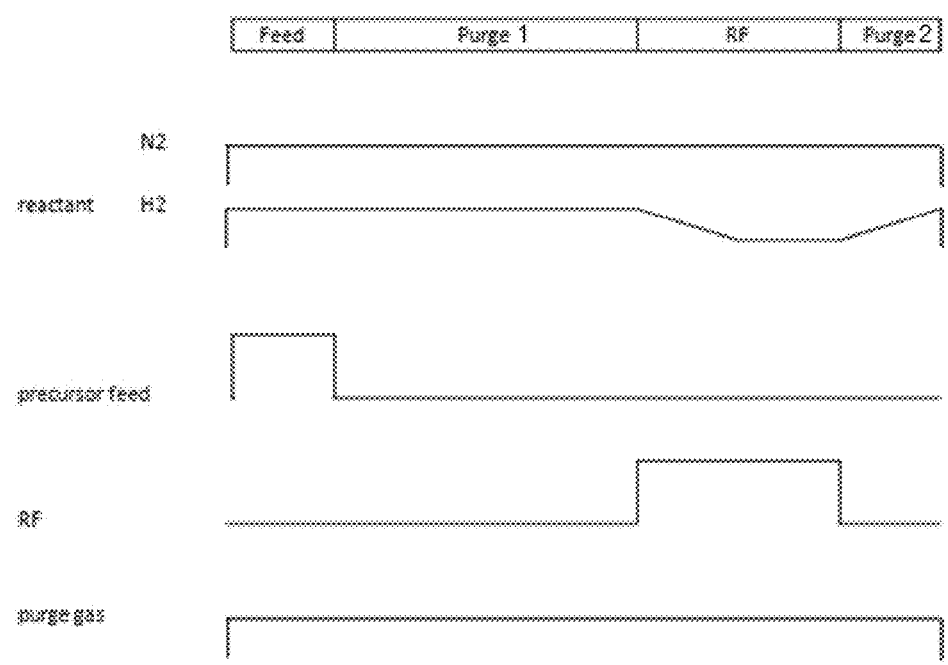
FIG. 9 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 9 illustrates one cycle of a PEALD process according to another embodiment of the present invention. The sequence illustrated in FIG. 9 is the same as that of FIG. 3 except that the second reactant flow is ramped down from the first flow ratio to the second flow ratio in the middle of "RF", and thereafter remains the second flow ratio until the end of "RF". When the time period of the ramping down of the second reactant flow is long enough, the reactivity of plasma deposition can be maintained.

Figure 10:
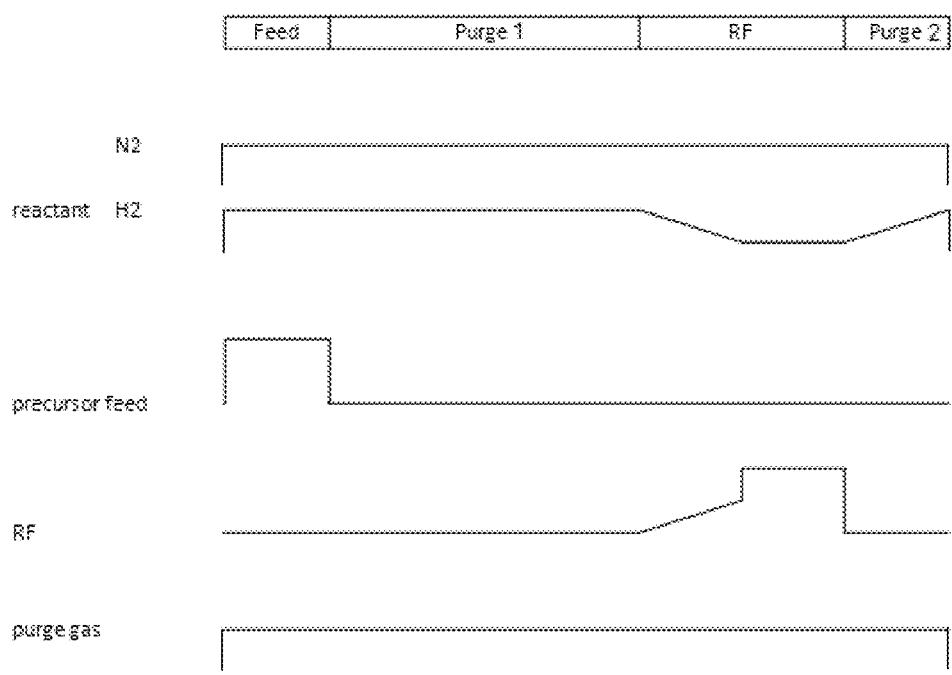
FIG. 10 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 10 illustrates one cycle of a PEALD process according to another embodiment of the present invention. The sequence illustrated in FIG. 10 is the same as that of FIG. 9 except that RF power is ramped up while the second reactant flow is ramped down in "RF". By conducting the above operation, the incorporation of the element of the second reactant can be reduced while maintaining reasonable reactivity of plasma deposition.

Figure 11:
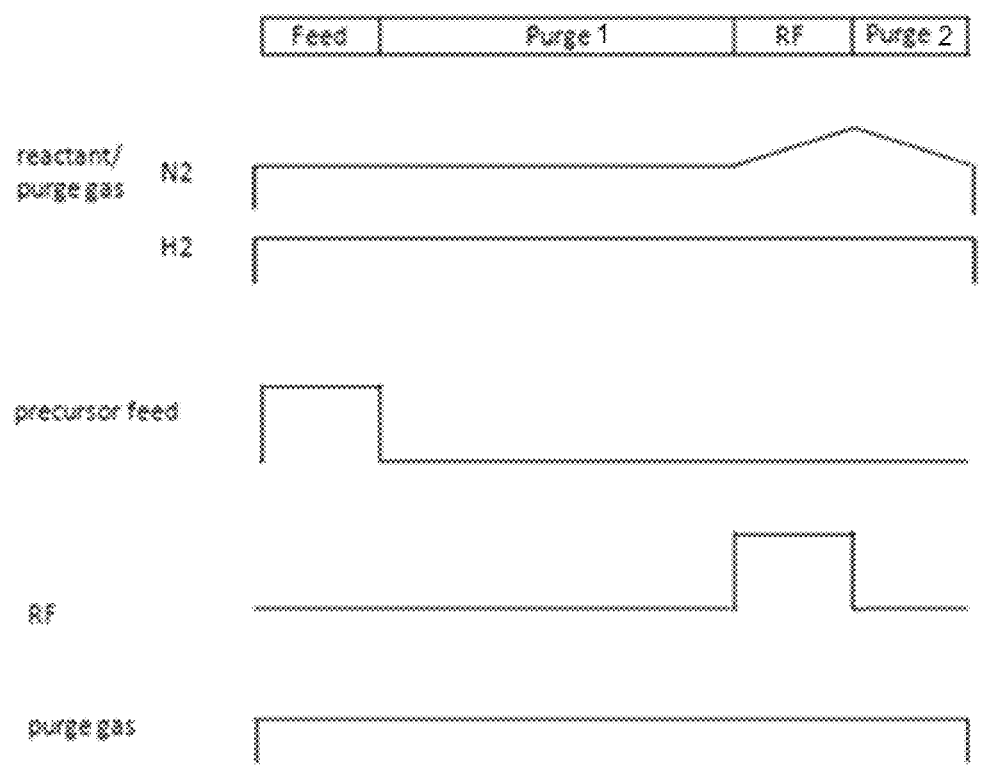
FIG. 11 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 11 illustrates one cycle of a PEALD process according to another embodiment of the present invention. The sequence illustrated in FIG. 11 is the same as that of FIG. 5 except that the second reactant flow is constant continuously throughout the cycle. However, because the first reactant flow is ramped up in "RF", the first flow ratio is reduced to the second flow ratio in "RF" due to the dilution of the second reactant by the ramp-up flow of the first reactant. Since the second reactant flow is maintained throughout the cycle, the reduction speed of the flow ratio with time is not as high as in the sequence of FIG. 5, and the second flow ratio is higher than in the sequence of FIG. 5, and thus, the incorporation of the element of the second reactant into the dielectric film is controlled less effectively than in the sequence of FIG. 5.

Figure 12:
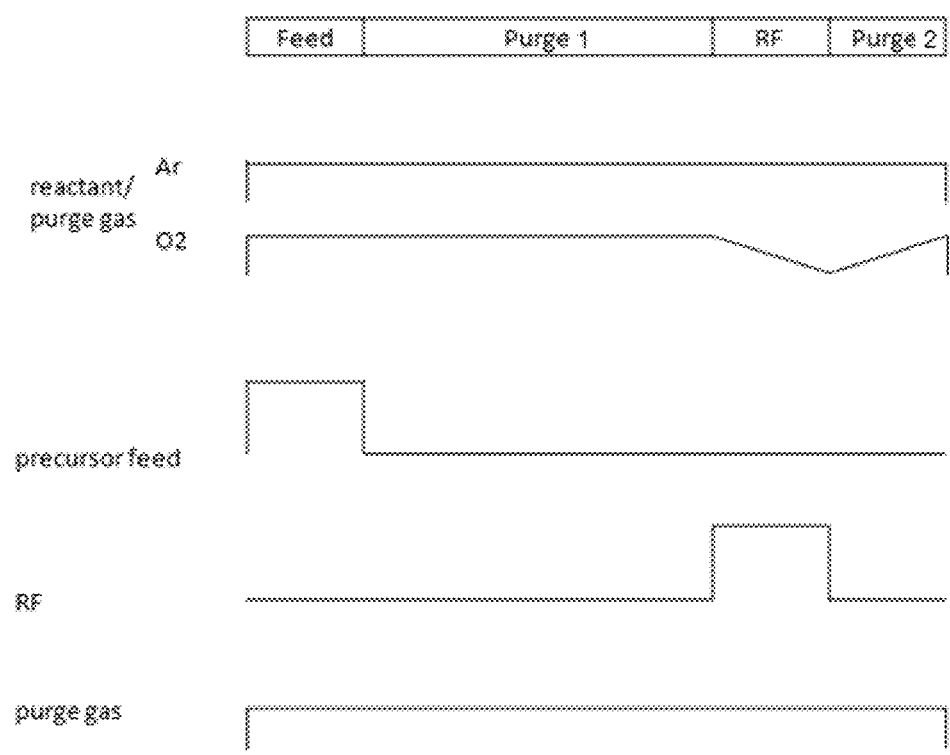
FIG. 12 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 12 illustrates one cycle of a PEALD process according to another embodiment of the present invention. The sequence illustrated in FIG. 12 is the same as that of FIG. 3 except that the first reactant is Ar, and the second reactant is oxygen, thereby depositing an oxide film, instead of a nitride film as in FIG. 3. As the second reactant, oxygen gas is responsible mainly for reactivity as with hydrogen, and as the first reactant, Ar is responsible mainly for ion bombardment as with nitrogen. The ramping down/up patterns disclosed herein in the sequences using hydrogen can be applied to sequences using oxygen or other reactant responsible for reactivity.

Figure 13:
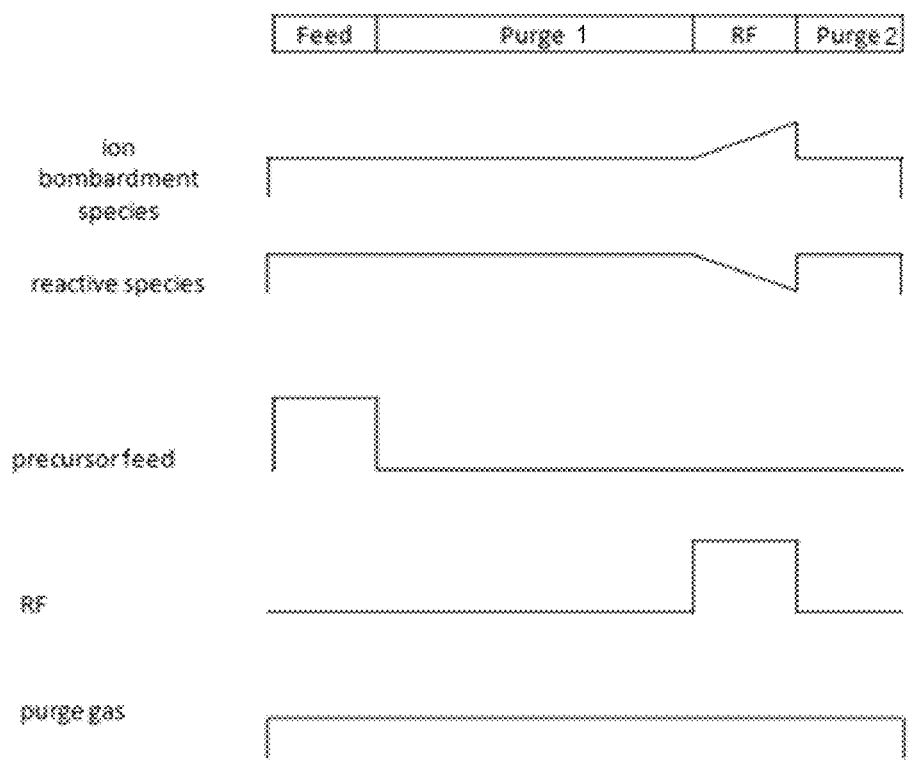
FIG. 13 illustrates one cycle of a PEALD process according to another embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 13 illustrates one cycle of a PEALD process according to another embodiment of the present invention. The sequence illustrated in FIG. 13 is the same as that of FIG. 5 except that the first reactant is more generally defined as "ion bombardment species" and the second reactant is more generally defined as "reactive species," and also no ramping up of "reactive species" and no ramping down of "ion bombardment species" are conducted. Since no ramping up of "reactive species" is conducted in "Purge 2", a problem of generation of particles may occur; however, the incorporation of reactive species into the dielectric film can be controlled as effectively as in the sequence of FIG. 5. This sequence can be applied to sequences using hydrogen, oxygen, or other second reactant which can serve as "reactive species".

Figure 14:
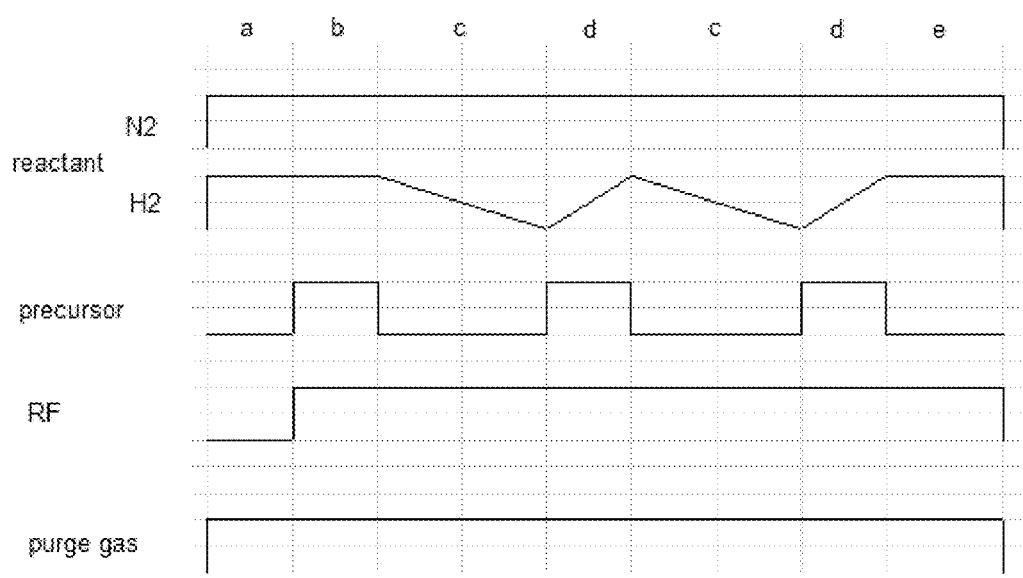
FIG. 14 illustrates a cyclic PECVD process according to an embodiment of the present invention, wherein the horizontal axis of the lines of the parameters does not necessarily represent the actual time length, and a raised level of the line of each parameter represents an ON-state wherein the vertical axis of each line does not necessarily represent the actual quantity whereas a bottom level of each line represents an OFF-state.

FIG. 14 illustrates a cyclic PECVD process according to an embodiment of the present invention. The ramping down/up patterns disclosed herein in the sequences of PEALD using the second reactant can be applied to sequences of other plasma-assisted cyclic deposition such as cyclic PECVD. In the sequence illustrated in FIG. 14, step a is a stabilization step where first and second reactants and a purge gas begin flowing into a reaction space without feeding a precursor and without applying RF power to the reaction space. The first reactant and the purge gas are continuously fed to the reaction space throughout the sequence. In step b, the precursor is fed into the reaction space and RF power is turned on. RF power is continuously applied to the reaction space throughout the sequence. In step b, all gases are in the reaction space while RF power is applied, thereby conducting gas phase plasma reaction and deposition of a dielectric film on a substrate. In step c, the precursor flow stops so that ALD-like deposition (self-limiting-like deposition) can be performed for good conformality. In step c, since RF power is kept on while maintaining the flows of the first and second reactants, the film deposited on the substrate is exposed to a plasma of the first and second reactants, thereby causing plasma reaction on the surface of the film in a manner similar to PEALD. As a result, the element of the second reactant ($H_2$ in this embodiment) is incorporated into the film as impurities. In this sequence, by conducting ramping down control of the second reactant as in the sequence of FIG. 3, for example, the incorporation of hydrogen can effectively be reduced while maintaining reactivity of plasma deposition. In step d, the flow ratio which has been reduced from a first flow ratio to a second flow ratio in step c is ramped up from the second flow ratio to resume the first flow ratio, while feeding the precursor and applying RF power to the reaction space. In this sequence, in step d, the second flow ratio is increased to resume the first flow ratio by ramping up the second reaction flow as in FIG. 3 for controlling generation of particles. In step d, a gas phase plasma deposition is conducted. Steps c and d are repeated multiple times as desired (for a target thickness of the film). Step e is the last step of cyclic PECVD. In this sequence, although no ramping down of the second reactant is conducted, the second reactant flow can be ramped down as in step c.

In all of the disclosed sequences, any one or more flow patterns can be used in any combination suitable for the intended purpose. Also, any one or more flow patterns can be expressly excluded from the available sequences conducted for the intended purpose.

In the sequences of PEALD disclosed herein, the precursor may be provided with the aid of a carrier gas. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle. As mentioned above, each pulse or phase of each deposition cycle is preferably self-limiting. An excess of precursor is supplied in each phase to saturate the susceptible structure surfaces. Surface saturation ensures precursor occupation of all available reactive sites (subject, for example, to physical size or "steric hindrance" restraints). In some embodiments the pulse time of precursor can be reduced such that complete saturation is not achieved and less than a monolayer is adsorbed on the substrate surface.

The continuous flow of the carrier gas can be accomplished using a flow-pass system (FPS) wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber, and can carry the precursor gas in pulses by switching the main line and the detour line. FIG. 1B illustrates a precursor supply system using a flow-pass system (FPS) according to an embodiment of the present invention (black valves indicate that the valves are closed). As shown in (a) in FIG. 1B, when feeding a precursor to a reaction chamber (not shown), first, a carrier gas such as Ar (or He) flows through a gas line with valves b and c, and then enters a bottle (reservoir) 20. The carrier gas flows out from the bottle 20 while carrying a precursor gas in an amount corresponding to a vapor pressure inside the bottle 20, and flows through a gas line with valves f and e, and is then fed to the reaction chamber together with the precursor. In the above, valves a and d are closed. When feeding only the carrier gas (noble gas) to the reaction chamber, as shown in (b) in FIG. 1B, the carrier gas flows through the gas line with the valve a while bypassing the bottle 20. In the above, valves b, c, d, e, and f are closed.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics, and gas flow controllers or valves of the reactor, as will be appreciated by the skilled artisan.

Figure 1B:
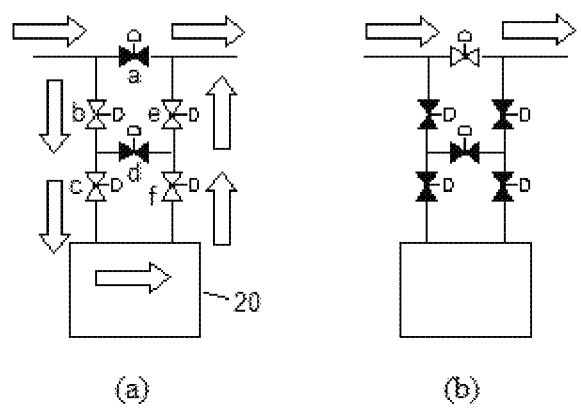
FIG. 1B illustrates a schematic representation of a precursor supply system using a flow-pass system (FPS) usable in an embodiment of the present invention.

The process cycle can be performed using any suitable apparatus including an apparatus illustrated in FIG. 1A, for example. FIG. 1A is a schematic view of a PEALD apparatus, desirably in conjunction with controls programmed to conduct the sequences described below, usable in some embodiments of the present invention. In this figure, by providing a pair of electrically conductive flat-plate electrodes 4, 2 in parallel and facing each other in the interior 11 (reaction zone) of a reaction chamber 3, applying HRF power (13.56 MHz or 27 MHz) 25 to one side, and electrically grounding the other side 12, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reactant gas and/or dilution gas, if any, and precursor gas are introduced into the reaction chamber 3 through a gas line 21 and a gas line 22, respectively, and through the shower plate 4. Additionally, in the reaction chamber 3, a circular duct 13 with an exhaust line 7 is provided, through which gas in the interior 11 of the reaction chamber 3 is exhausted. Additionally, a transfer chamber 5 disposed below the reaction chamber 3 is provided with a seal gas line 24 to introduce seal gas into the interior 11 of the reaction chamber 3 via the interior 16 (transfer zone) of the transfer chamber 5 wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition of multi-element film and surface treatment are performed in the same reaction space, so that all the steps can continuously be conducted without exposing the substrate to air or other oxygen-containing atmosphere.

In some embodiments, in the apparatus depicted in FIG. 1A, the system of switching flow of an inactive gas and flow of a precursor gas illustrated in FIG. 1B (described earlier) can be used to introduce the precursor gas in pulses without substantially fluctuating pressure of the reaction chamber.

A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

In some embodiments, a dual chamber reactor (two sections or compartments for processing wafers disposed closely to each other) can be used, wherein a reactant gas and a noble gas can be supplied through a shared line whereas a precursor gas is supplied through unshared lines.

In some embodiments, PEALD cycles may be conducted under the conditions shown in Table 1 below.

TABLE 1

(numbers are approximate)
Conditions for PEALD

| | |
|---|---|
| Substrate temperature | 25 to 800° C. (preferably 50 to 550° C.) |
| Electrode gap (thickness of a substrate is about 0.7 mm) | 4 to 40 mm (preferably 8 to 15 mm) |
| Pressure | 10 to 2000 Pa (preferably 100 to 800 Pa) |
| Flow rate of carrier gas (continuous) | 100 to 5000 sccm (preferably 1000 to 3000 sccm) |
| Flow rate of precursor | Corresponding to the flow rate of carrier gas |

TABLE 1-continued (numbers are approximate)
Conditions for PEALD

| | |
|---|---|
| Flow rate of purge gas (continuous) | 0 to 15000 sccm (preferably 0 to 6000 sccm) |
| Flow rate of $1^{st}$ reactant (continuous) | 1000 to 15000 sccm (preferably 1000 to 6000 sccm) |
| Flow rate of $2^{nd}$ reactant | Continuous: 100 to 5000 sccm (preferably 100 to 2000 sccm) at first flow ratio<br>Ramp down/up: 0 to 1000 sccm/sec. (preferably 0 to 500 sccm/sec.)<br>Stepwise: 100 to 1000 sccm/step (preferably 100 to 500 sccm/step) at a step duration of 0.5 to 5 sec. (preferably 0.5 to 1 sec.) |
| First flow ratio (flow rate of $2^{nd}$ reactant/total flow rate at the beginning of "RF") | 1/1 to 1/200 (preferably 1/5 to 1/100) |
| Second flow ratio (flow rate of $2^{nd}$ reactant/total flow rate at the end of "RF") | 0 to 1/10 (preferably 0 to 1/100) |
| RF power (13.56 MHz) for a 300-mm wafer | Continuous: 25 to 1000 W (preferably 50 to 600 W)<br>Ramp up: 20 to 500 W/sec. (preferably 50 to 200 W/sec.) |
| Duration of "Feed" | 0.05 to 10 sec. (preferably 0.1 to 1.5 sec.) |
| Duration of "Purge 1" | 0.05 to 10 sec. (preferably 0.2 to 1.5 sec.) |
| Duration of "RF" | 0.1 to 20 sec. (preferably 1 to 5 sec.) |
| Duration of "Purge 2" | 0.1 to 10 sec. (preferably 0.1 to 1 sec.) |
| Duration of one cycle | 0.3 to 50 sec. (preferably 0.5 to 5 sec.) |
| Glow rate per cycle (nm/min) | 0.001 to 0.1 (preferably 0.01 to 0.1) on top surface |

The terms "Feed", "Purge 1", "RF", and "Purge 2" correspond to those shown in FIGS. 3-13. In "RF", the second reactant flow can reach the second flow ratio before the end of "RF" and maintain the second flow ratio until the end of "RF". Ramping down/up of other gas flow, if applicable, can be conducted in a manner similar to the ramping down/up of the second reactant shown in the above table. The above indicated RF power for a 300-mm wafer can be converted to W/cm$^2$ (wattage per unit area of a wafer) which can apply to wafers having different diameters such as 200 mm or 450 mm.

In some embodiments, cyclic PECVD may be conducted under the conditions shown in Table 2 below.

TABLE 2

(numbers are approximate)
Conditions for PECVD

| | |
|---|---|
| Substrate temperature | 25 to 800° C. (preferably 50 to 550° C.) |
| Electrode gap (thickness of a substrate is about 0.7 mm) | 4 to 40 mm (preferably 8 to 15 mm) |
| Pressure | 10 to 2000 Pa (preferably 100 to 800 Pa) |
| Flow rate of carrier gas (continuous) | 100 to 5000 sccm (preferably 1000 to 3000 sccm) |
| Flow rate of precursor | Corresponding to the flow rate of carrier gas |
| Flow rate of purge gas (continuous) | 0 to 15000 sccm (preferably 0 to 6000 sccm) |
| Flow rate of $1^{st}$ reactant (continuous) | 1000 to 15000 sccm (preferably 1000 to 6000 sccm) |
| Flow rate of $2^{nd}$ reactant | Continuous: 100 to 5000 sccm (preferably 100. to 2000 sccm) at first flow ratio<br>Ramp down/up: 0 to 1000 sccm/sec. (preferably 0 to 500 sccm/sec.)<br>Stepwise: 100 to 1000 sccm/step (preferably 100 to 500 sccm/step) at a step duration of 0.5 to 5 sec. (preferably 0.5 to 1 sec.) |
| First flow ratio (flow rate of $2^{nd}$ reactant/total flow rate at the beginning of "RF") | 1/1. to 1/200 (preferably 1/5 to 1/100) |
| Second flow ratio (flow rate of $2^{nd}$ reactant/total flow rate at the end of "RF") | 0 to 1/10 (preferably 0 to 1/100) |
| RF power (13.56 MHz) for a 300-mm wafer (continuous) | 25 to 1000 W (preferably 50 to 600 W) |
| Duration of "step a" | 5 to 60 sec. (preferably 10 to 20 sec.) |
| Duration of "step b" | 0.05 to 5 sec. (preferably 0.1 to 1 sec.) |
| Duration of "step c" | 0.05. to 20 sec. (preferably 0.5 to 5 sec.) |
| Duration of "step d" | 0.05 to 5 sec. (preferably 0.1 to 1 sec.) |
| Duration of "step e" | 01 to 20 sec. (preferably 5 to 10 sec.) |
| Number of cycles of steps c and d | As required to reach target film thickness |
| Glow rate per cycle (nm/cycle) | 0.1 to 20 (preferably 0.5 to 5) on top surface |

The terms "step a", "step b", "step c", "step d", and "step e" correspond to those shown in FIG. 14. In "step c", the second reactant flow can reach the second flow ratio before the end of "step c" and maintain the second flow ratio until the end of "step c". Ramping down/up of other gas flow, if applicable, can be conducted in a manner similar to the ramping down/up of the second reactant shown in the above table. The above indicated RF power for a 300-mm wafer can be converted to W/cm$^2$ (wattage per unit area of a wafer) which can apply to wafers having different diameters such as 200 mm or 450 mm.

In some embodiments, the dielectric film as deposited is subjected to post-deposition treatment using a plasma of Ar, He, N$_2$, H$_2$, or a mixture of the foregoing at a given ratio without feeding a precursor under conditions shown in Table 3 below.

TABLE 3

(numbers are approximate)
Conditions for post-deposition treatment

| | |
|---|---|
| Substrate temperature | 25 to 800° C. (preferably 50 to 600° C.) |
| Electrode gap (thickness of a substrate is about 0.7 mm) | 5 to 20 mm (preferably 8 to 15 mm) |
| Pressure | 10 to 5000 Pa (preferably 100 to 3000 Pa) |
| Flow rate of treatment gas (continuous) | 500 to 10000 sccm (preferably 2000 to 6000 sccm) |
| RF power (13.56 MHz) for a 300-mm wafer (continuous) | 50 to 1500 W (preferably 200 to 1000 W) |
| Duration of treatment | 30 to 1200 sec. (preferably 30 to 600 sec.) |

In some embodiments, the post-deposition treatment can be conducted after completion of deposition of the dielectric film. In some embodiments, the post-deposition treatment can be conducted after every given number of cycles of deposition (e.g., 2 to 100, preferably 10 to 50).

In some embodiments, a dielectric film in trenches of a substrate is deposited in a trench of a substrate by plasma-assisted cyclic deposition. In this disclosure, a recess between adjacent vertical spacers and any other recess pattern are referred to as a "trench". That is, the trench is any recess pattern including a pattern formed by vertical spacers and which has, in some embodiments, a width of about 20 nm to about 100 nm (typically about 30 nm to about 50 nm) (wherein when the trench has a length substantially the same as the width, it is referred to as a hole/via, and a diameter thereof is about 20 nm to about 100 nm), a depth of about 30 nm to about 100 nm (typically about 40 nm to about 60 nm), and an aspect ratio of about 2 to about 10 (typically about 2 to about 5). The proper dimensions of the trench may vary depending on the process conditions, film compositions, intended applications, etc.

The present invention is further explained with reference to working examples below. However, the examples are not intended to limit the present invention. In the examples where conditions and/or structures are not specified, the skilled artisan in the art can readily provide such conditions and/or structures, in view of the present disclosure, as a matter of routine experimentation. Also, the numbers applied in the specific examples can be modified by a range of at least ±50% in some embodiments, and the numbers are approximate.

EXAMPLES

Examples 1 and 2, and Comparative Examples 1 and 2

A film was formed on a substrate (having a diameter of 300 mm and a thickness of 0.7 mm) having trenches with a width (opening) of approximately 30 nm and a depth of approximately 85 nm (with an aspect ratio of about 3), by PEALD, using a sequence illustrated in FIG. 3, one cycle of which was conducted under conditions shown in Table 4 (process cycle) below using the PEALD apparatus illustrated in FIG. 1A and a gas supply system (FPS) illustrated in FIG. 1B. The resultant films were analyzed in terms of wet etch rate and conformality. The results are shown in FIG. 16. FIG. 16 is a table showing wet etching results of films deposited by PEALD according to Comparative Example 1, Example 1, Comparative Example 2, and Example 2. In the table, the cells in gray indicate that the numbers written in the cells satisfy common industrial or internal standards; "etch condition" refers to the conditions of wet etching conducted to the deposited film in each experiment using 100:1 dHF for 5 minutes (Com. Ex. 1 and Ex. 1) or 6 minutes (Com. Ex. 2 and Ex. 2) at a temperature of 25° C.; "conformality" refers to a conformality (%) of the deposited film in the trench having an aspect ratio of about 3 before wet etching wherein the numbers in parentheses indicate percentage points representing measurement errors and/or local variations in thickness; "WERR relative to Tox" refers to wet etch rate relative to that of standard thermal oxide film which is considered to be one wherein "±" represents measurement errors and/or locational variations in wet etch rate, and wherein "field" refers to wide flat area; and "WERR conformality" refers to a conformality (ratio) of the etched film in the trench wherein the numbers in parentheses indicate percentage points representing measurement errors and/or local variations in thickness.

In addition, the same film was deposited on a substrate having spaced trenches (in a dense area) having a width (opening) of 35 nm and a depth of 85 nm (with an aspect ratio of about 3) and a substrate having narrow trenches (in an isolated area) having a width (opening) of 72 nm and a depth of 85 nm (with an aspect ratio of about 1) to examine differences in conformality of film in the spaced trenches and the isolated trenches. In the table of FIG. 16, "loading" refers to a percentage calculated by dividing thickness of the sidewall film in a dense area ("narrow" refers to an area where intervals between trenches are small) by thickness of the sidewall film in an isolated area ("spaced" refers to an area where intervals between trenches are large enough to consider the trenches to be isolated) wherein "±" represents measurement errors and/or local variations in wet etch rate.

TABLE 4

(numbers are approximate)
Common Conditions for PEALD

| | |
|---|---|
| Deposition temperature | 400° C. for Comparative Example 1 (Com. Ex. 1) and Example 1 (Ex. 1) |
| | 550° C. for Comparative Example 2 (Com. Ex. 2) and Example 2 (Ex. 2) |
| Electrode gap (thickness of a substrate is about 0.7 mm) | 13 mm |
| Pressure | 350 Pa |
| Precursor | Dichlorosilane (DCS) |
| Flow rate of purge gas (N2) (continuous) | 11000 sccm |
| Flow rate of $1^{st}$ reactant ($N_2$) (continuous) | 1st reatctant and purge are the same here |
| Flow rate of $2^{nd}$ reactant ($H_2$) | Continuous: 100 sccm common to Com. Ex. 1, Ex. 1, Com. Ex. 2, and Ex. 2 |
| Flow rate of $2^{nd}$ reactant ($H_2$) | |
| First flow ratio (flow rate of $H_2$/total flow rate at the beginning of "RF") | Ramp down/up: 150 sccm/sec., Lowest: 0 sccm for Ex. 1 and Ex. 2 |
| | 0.07 |
| Second flow ratio (flow rate of $H_2$/total flow rate at the end of "RF") | 0.07 for Com. Ex. 1 and Com. Ex. 2 |
| Second flow ratio (flow rate of $H_2$/total flow rate at the end of "RF") | 0 for Ex. 1 and Ex. 2 |
| RF power (13.56 MHz) | 145 W |
| Duration of "Feed" | 0.3 sec. |
| Duration of "Purge 1" | 0.5 sec. |
| Duration of "RF" | 3.2 sec. |
| Duration of "Purge 2" | 0.1 sec. |
| Duration of one cycle | 4.1 sec. |
| Glow rate per cycle (nm/min) | 0.6 on top surface |
| Deposition temperature (C) | Example 1 and com 1:550 example 2 and com 2:450 |

As shown in the table (FIG. 16), when the $H_2$ flow was ramped down in "FR" in Examples 1 and 2 as shown in Table 5 above, the wet etch rate of the film significantly improved at all of "field", "top", "side", and "bottom", as compared with the constant $H_2$ flow in Comparative Examples 1 and 2. Further, as shown in the table (FIG. 16), the ramp-down operation also demonstrated additional benefits in term of conformality.

Examples 3-5, and Comparative Examples 3-5

Figure 15:
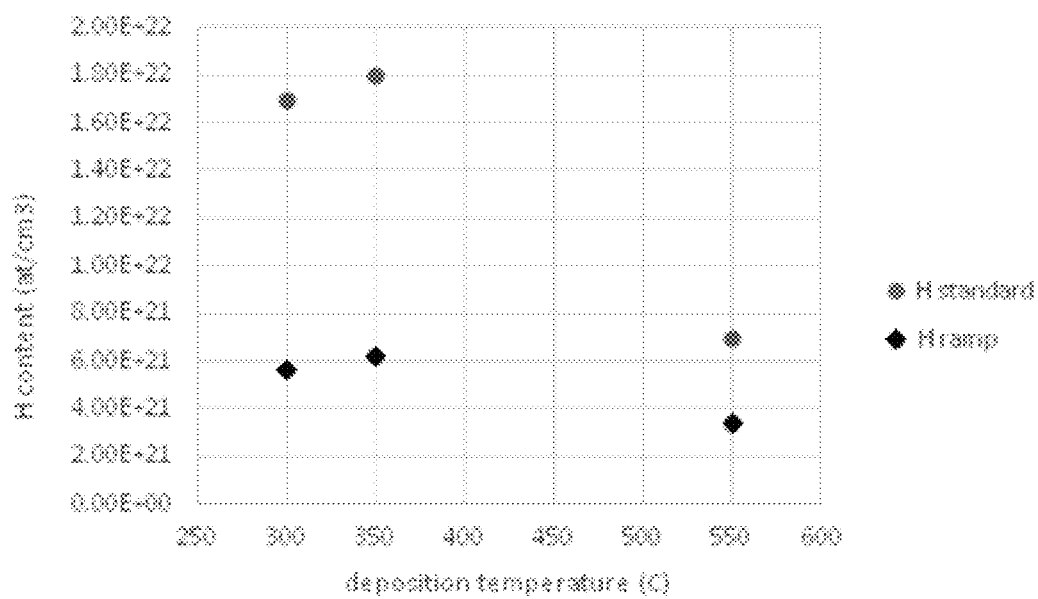
FIG. 15 is a graph showing the relationship between the hydrogen content of film and the deposition temperature of film deposited by PEALD when a hydrogen gas flow was constant (marked with ●) and when a hydrogen flow was ramped down (marked with ◆) according to an embodiment.

In Examples 3-5, films were deposited in the same manner as in Examples 1 and 2 except that the deposition temperature was 300° C. (Example 3), 350° C. (Example 4), and 550° C. (Example 5), and in Comparative Examples 3-5, films were deposited in the same manner as in Comparative Examples 1 and 2 except that the deposition temperature was 300° C. (Comparative Example 3), 350° C. (Comparative Example 4), and 550° C. (Comparative Example 5). The hydrogen content (atom/$cm^3$) of each film was measured by SIMS. The results are shown in FIG. 15. FIG. 15 is a graph showing the relationship between the hydrogen content of film and the deposition temperature of film deposited by PEALD when a hydrogen gas flow was constant (marked with ●) in Comparative Examples 3-5 and when a hydrogen flow was ramped down (marked with ♦) in Examples 3-5. As shown in FIG. 15, when the $H_2$ flow was ramped down" in Examples 3-5, the hydrogen content of each film became significantly lower than that when the $H_2$ flow was constant in Comparative Examples 3-5, especially when the deposition temperature was 350° C. or lower (generally when the deposition temperature is 400° C. or lower, this effect is more prominent). Considering the results shown in FIG. 16, it can be concluded that the ramp-down operation can lower the content of hydrogen incorporated into a film as impurities, and contribute to an increase in chemical resistance (e.g., lower wet etch rate) of the film.

Example 6

In Example 6, multiple films were deposited on a silicon substrate as follows: In step 1 (St1), a first SiN film was deposited by low-pressure CVD (LPCVD) using dichlorosilane (DCS) as a precursor and $N_2/H_2$ as reactants; in step 2 (St2), a second SiN film was deposited on the first SiN film by standard PEALD using DCS as a precursor and $N_2/H_2$ as reactants in a manner substantially similar to that in Comparative Example 1 (except that the deposition temperature was 350° C.); in step 3 (St3), a third SiN film was deposited on the second SiN film by ramp PEALD (PEALD with ramp-down reactant flow is referred to as "ramp PEALD") using DCS as a precursor and $N_2/H_2$ as reactants in a manner substantially similar to that in Example 1 (except that the deposition temperature was 350° C.); in step 4 (St4),), a fourth SiN film was deposited on the third SiN film by PEALD using $H_2SiI_2$ as a precursor and $N_2/H_2$ as reactants at a temperature of 350° C. in a manner similar to that in Example 1 disclosed in United States Patent Application Publication No. 2014/0273528 (the disclosure of which is incorporated herein by reference in its entirety); in step 5 (St5), a fifth SiN film was deposited on the fourth SiN film by ramp PEALD using $H_2SiI_2$ as a precursor and $N_2/H_2$ as reactants at a temperature of 300° C. in a manner similar to that in Example 1 disclosed in United States Patent Application Publication No. 2014/0273528, except that the hydrogen flow was ramped down as in Example 1 in this disclosure; in step 6 (St6), a sixth SiN film was deposited on the fifth SiN film by standard PEALD using DCS as a precursor and $N_2/H_2$ as reactants in a manner substantially similar to that in Comparative Example 1 (except that the deposition temperature was 300° C.); in step 7 (St7), a seventh SiN film was deposited on the sixth SiN film by ramp PEALD using DCS as a precursor and $N_2/H_2$ as reactants in a manner substantially similar to that in Example 1 (except that the deposition temperature was 300° C.); and in step 8 (St8),), an eighth SiN film was deposited on the seventh SiN film by PEALD using $H_2SiI_2$ as a precursor and $N_2/H_2$ as reactants at a temperature of 300° C. in a manner similar to that in Example 1 disclosed in United States Patent Application Publication No. 2014/0273528. The resultant laminate of multiple SiN films was subjected to composition analysis by SIMS. The results are shown in FIG. 17.

Figure 17:
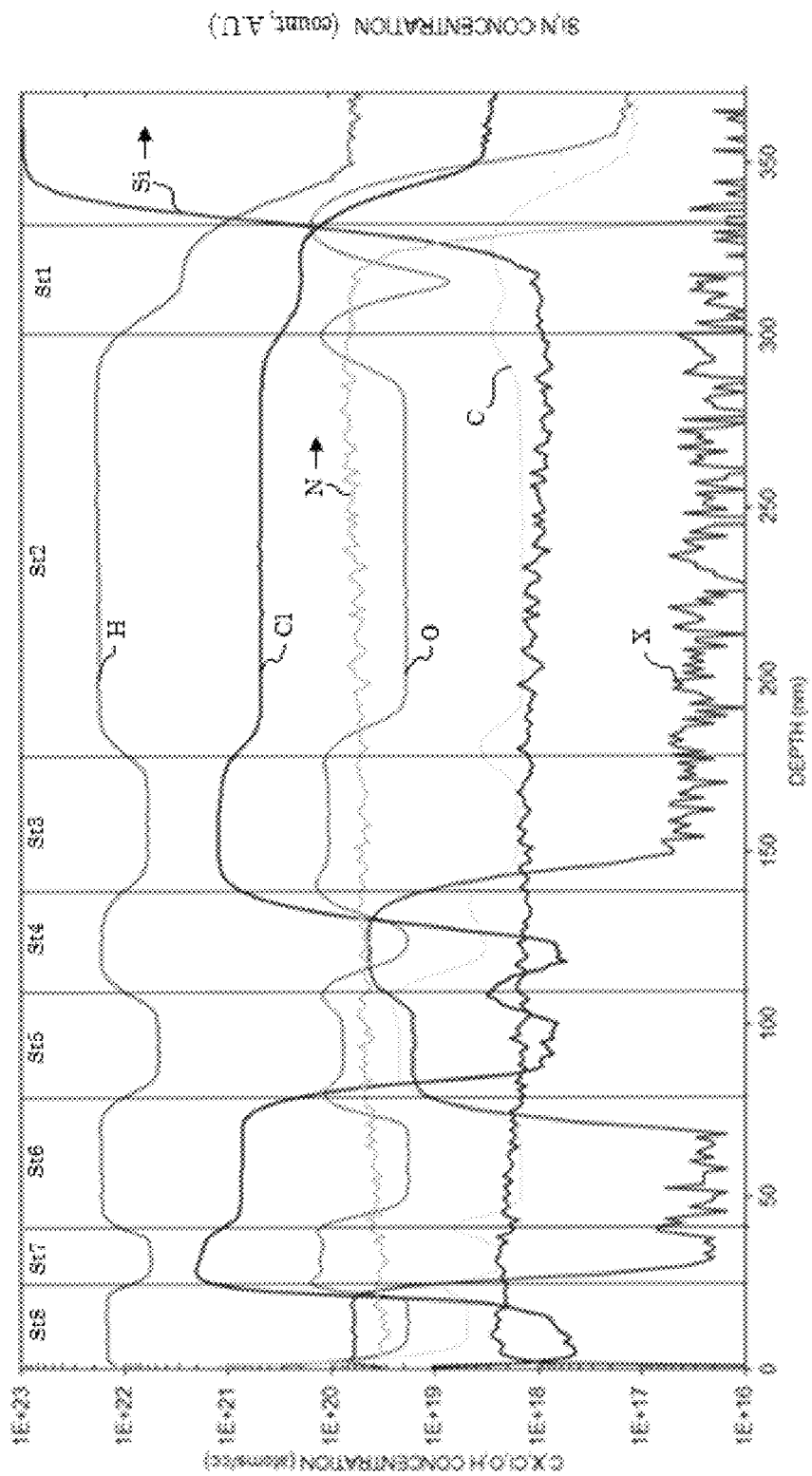
FIG. 17 is a chart showing the concentrations (atoms/cc) of H, Cl, N, O, C, X (X is I), and Si of a laminate of multiple films in relation to the depth of film deposited by PEALD according to an embodiment of the present invention.

FIG. 17 is a chart showing the concentrations (atoms/cc) of H, Cl, N, O, C, X (X is I), and Si of the laminate of multiple films in relation to the depth of film deposited by PEALD. As shown in FIG. 17, the concentrations of Si and N were substantially constant throughout the laminate in the thickness direction, regardless of the type of precursor and the deposition method. The concentrations of Cl and X (I) in the laminate in the thickness direction were dependent on the type of precursor, i.e., whether the precursor contained Cl or I as a halogen. The concentration of C in the laminate in the thickness direction was rather dependent on the type of precursor. The concentrations of H and O in the laminate in the thickness direction were highly dependent on whether the reactant ($H_2$) flow was ramped down or constant, wherein the changing pattern of H concentration and that of O concentration were substantially inverse, i.e., when the H concentration increased, the O concentration decreased, and vice versa. Regardless of the type of deposition method and the type of precursor, when the reactant flow was ramped down during application of RF power (in St3 (PEALD with DCS), St5 (PEALD with $H_2SiI_2$), and St7 (PEALD with DCS), the H concentration in the respective films was effectively decreased, which is indicative of improved chemical resistance of the respective films.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A method for forming a nitride or oxide film by plasma-assisted cyclic deposition, comprising: (i) feeding a first reactant, a second reactant, and a precursor to a reaction space where a substrate is placed, said second reactant being constituted by a hydrogen-containing compound or oxygen-containing compound or a nitrogen-containing compound, wherein the second reactant flows at a first flow ratio wherein a flow ratio is defined as a ratio of a flow rate of the second reactant to a total flow rate of gases flowing in the reaction space; (ii) stopping feeding the precursor while continuously feeding the first and second reactants at a flow ratio which is gradually reduced from the first flow ratio to a second flow ratio while applying RF power to the reaction space to expose the substrate to a plasma; and (iii) repeating steps (i) and (ii) until a desired thickness of the nitride or oxide film is obtained.

2. The method according to claim 1, wherein the plasma-assisted cyclic deposition is cyclic plasma-enhanced chemical vapor deposition (cyclic PECVD), wherein RF power is continuously supplied throughout steps (i) and (ii).

3. The method according to claim 2, wherein in step (ii), the flow of the second reactant is ramped down.

4. The method according to claim 1, wherein the plasma-assisted cyclic deposition is plasma-enhanced atomic layer deposition (PEALD), wherein RF power is not supplied during step (i).

5. The method according to claim 4, wherein a repeating cycle of PEALD further comprises:
(ia) purging the reaction space while continuously supplying the first and second reactants without supplying the precursor and without applying RF power after step (i); and
(iia) purging the reaction space while continuously supplying the first reactant or the first and second reactants after step (ii).

6. The method according to claim 5, wherein in step (ii), the flow of the second reactant is ramped down.

7. The method according to claim 6, wherein in step (ii), the flow of the second reactant is ramped down at a constant rate.

8. The method according to claim 6, wherein in step (ii), the flow of the second reactant is ramped down stepwise.

9. The method according to claim 5, wherein in step (iia), the flow of the second reactant remains at the second flow ratio.

10. The method according to claim 5, wherein in step (i), the flow of the second reactant starts at the second flow ratio at the beginning of step (i) and is ramped up from the second flow ratio to the first flow ratio.

11. The method according to claim 5, wherein in step (ii), RF power is ramped up while the flow of the second reactant is ramped down.

12. The method according to claim 5, wherein in step (ii), the flow of the second reactant is ramped down to the second flow ratio before an end of step (ii) and remains at the second flow ratio until the end of step (ii).

13. The method according to claim 12, wherein in step (ii), RF power is higher while the flow of the second reactant remains at the second flow ratio, than while the flow of the second reactant is ramped down.

14. The method according to claim 5, wherein in step (i) through step (iia), the flow of the first reactant is changed in a manner compensating for the change of the flow of the second reactant so that a sum of the flow of the first reactant and the flow of the second reactant remains constant.

15. The method according to claim 5, wherein the repeating cycle of PEALD further comprises supplying a purge gas other than the first and second reactants.

16. The method according to claim 1, wherein in step (ii), the second flow ratio is zero.

17. The method according to claim 1, wherein the nitride or oxide film is a silicon nitride film or silicon oxide film, and the precursor contains silicon.

18. The method according to claim 17, wherein the nitride or oxide film is the silicon nitride film.

19. The method according to claim 1, wherein the precursor contains a halogen.

20. The method according to claim 1, further comprising, as a post-deposition treatment, exposing the substrate to a plasma of Ar, He, $N_2$, $H_2$, or a mixture of the foregoing at a given ratio.

* * * * *